United States Patent [19]

Yamada et al.

[11] Patent Number: 4,868,627

[45] Date of Patent: Sep. 19, 1989

[54] COMPLEMENTARY SEMICONDUCTOR INTEGRATED CIRCUIT DEVICE CAPABLE OF ABSORBING NOISE

[75] Inventors: Akira Yamada; Tsunenori Umeki, both of Hyogo, Japan

[73] Assignee: Mitsubishi Denki Kabushiki Kaisha, Tokyo, Japan

[21] Appl. No.: 213,105

[22] Filed: Jun. 28, 1988

[30] Foreign Application Priority Data

Jun. 30, 1987 [JP] Japan .................. 62-164324

[51] Int. Cl.⁴ .......................................... H03L 3/353
[52] U.S. Cl. .................................. 357/42; 307/443; 307/542; 307/451; 307/585; 307/246; 357/51; 357/44
[58] Field of Search .................. 357/51, 44, 42

[56] References Cited

U.S. PATENT DOCUMENTS 4,168,442  9/1979  Satou .................................. 357/42
4,682,203  7/1987  Konda ................................ 357/51

OTHER PUBLICATIONS

Sze, S. M., "Physics of Semiconductor Devices", John Wiley and Sons, New York, 1981, pp. 373-374.

Primary Examiner—Martin H. Edlow
Assistant Examiner—David Soltz
Attorney, Agent, or Firm—Lowe, Price, LeBlanc, Becker & Shur

[57] ABSTRACT

A complementary semiconductor integrated circuit for absorbing a noise comprises an n-type semiconductor substrate maintained at a supply voltage, a p-type well maintained at the reference voltage potential, an n-type region formed in the n-type semiconductor substrate and connected to the supply voltage, a polysilicon layer formed on the n-type region through an insulating film and connected to the reference voltage, whereby a capacitance is formed by the n-type region and the polysilicon layer formed on the n-type region through the insulating film. A noise included in the supply voltage is absorbed by the capacitance.

11 Claims, 6 Drawing Sheets

COMPLEMENTARY SEMICONDUCTOR INTEGRATED CIRCUIT DEVICE CAPABLE OF ABSORBING NOISE

BACKGROUND OF THE INVENTION

1. Field of the Invention

The present invention relates to a complementary semiconductor integrated circuit device, and more particularly, to a complementary semiconductor integrated circuit device capable of decreasing a fluctuation of the potential caused by a noise included in the power supply line and/or the reference voltage line.

2. Description of the Prior Art

A conventional complementary semiconductor integrated circuit device is described by taking an inverter circuit as an example. In order to simplify the description, the construction of an inverter comprising an n-type substrate including a p-well is hereinafter described. An inverter comprising the n-type substrate including an n-well and the p-well, an inverter comprising the p-type substrate including the n-well, and an inverter comprising the p-type substrate including the n-well and the p-well may be described.

FIG. 1 is a plan view showing a conventional CMOS inverter. 2 is a sectional view taken along the line II—II. The conventional CMOS inverter is described with reference to FIGS. 1 and 2. The conventional CMOS inverter comprises a p-channel MOS transistor $T_P$ formed on an n-type semiconductor substrate 1, an n-channel MOS transistor $T_N$ formed in a p-well provided in the n-type semiconductor substrate 1, a field oxide film 3 adapted for disconnecting the p-channel MOS transistor $T_P$ from the n-channel MOS transistor $T_N$.

The p-channel MOS transistor $T_P$ includes p-type diffusion layers 11 and 12, a gate 6 of polysilicon formed on a channel region 15 provided therebetween through an insulating film.

The n-channel MOS transistor $T_N$ includes n-type diffusion layers 13 and 14, the gate 6 of polysilicon which serves as the input of the CMOS inverter and is formed on the channel region 15 provided therebetween through the insulating film.

The P-type diffusion layer 12 which serves as the source of the p-channel MOS transistor $T_P$ is disposed adjacently to an n-type diffusion layer 4 for providing a potential to the n-type semiconductor substrate 1. An aluminum wire 7 which serves for providing supply voltage to the inverter is connected to the p-type diffusion layer 12 and the n-type diffusion layer 4 through a contact hole 10.

The n-type diffusion layer 14 which serves as the source of the n-type channel MOS transistor $T_N$ is disposed adjacently to a p-type diffusion layer 5 for providing a potential to the p-well. An aluminum wire 8 which serves for providing the reference voltage to the inverter is connected to the n-type diffusion layer 14 and the p-type diffusion layer 5.

An aluminum wire 9 which serves as the output of the CMOS inverter is connected to the p-type diffusion layer 11 which serves as the drain of the p-channel MOS transistor $T_P$ and the n-type diffusion layer 13 which serves as the drain of the n-channel MOS transistor $T_N$.

The description of the layout pattern and the equivalent circuit of an inverter circuit is omitted herein: They are described, for example, in "Principle of CMOS VLSI Design A Systems Perspective " written by Weste et al. and published by N.H.E. in 1985.

FIG. 3 shows the equivalent circuit of the inverter shown in FIGS. 1 and 2.

The inverter includes the p-channel transistor $T_P$ and the n-channel transistor $T_N$ connected in series between the power supply $V_{DD}$ and the reference voltage.

The operation of the inverter is described with reference to FIG. 3. The signal inputted to the inverter is applied to the gates of the p-channel MOS transistor $T_P$ and the n-channel MOS transistor $T_N$. When a high level voltage is applied to the input terminal IN of the inverter, the n-channel MOS transistor $T_N$ is turned on and the p-channel MOS transistor $T_P$ is turned off. As a result, the inverter outputs a low level voltage. When a low level voltage is applied to the input terminal IN of the inverter, the p-channel transistor $T_P$ is turned on and the n-channel transistor $T_N$ is turned off. As a result, the inverter outputs a high level signal.

The inverter with which a conventional complementary semiconductor circuit device is equipped is constructed as above. It is to be noted that the power supply $V_{DD}$, and the reference voltage are connected directly to the sources of the p-channel transistor $T_P$ and the n-channel transistor $T_N$, respectively.

Such a construction has a disadvantage in that a noise included in the power supply $V_{DD}$ or the reference voltage causes the potentials thereof to change, and the inverter functions improperly. Therefore, the development of a complementary semiconductor circuit device capable of minimizing the change of the potentials of the power supply and/or the reference voltage has been desired.

SUMMARY OF THE INVENTION

The present invention was made with a view to substantially solving the above described disadvantage and its essential object is to provide a complementary semiconductor integrated circuit device capable of minimizing the change of potentials of the power supply and/or the reference voltage caused by a noise included therein.

The above described object of the present invention is achieved by connecting a means for absorbing the noise to the power supply or the ground reference voltage.

A complementary semiconductor integrated circuit device in accordance with the present invention comprises a first conductivity type layer having a first potential applied thereto a second conductivity type layer provided adjacently to the first conductivity type layer and having a second potential applied thereto, and a capacitance formed on either the first conductivity type layer or the second conductivity type layer for absorbing a noise included in the first potential or the second potential.

According to the above described construction, the capacitance is capable of absorbing a noise included in the first or second potential. Accordingly, this construction is capable of minimizing the potential change of the power supply or the reference voltage when the noise is included therein.

A complementary semiconductor integrated circuit device in accordance with a preferred embodiment of the present invention comprises a first region of a first conductivity type having a first potential; a first region of a second conductivity type being different from the first conductivity having second potential; a second region of a first conductivity type having the first potential formed in the first region of the first conductivity type; and a first conductive layer having the second potential formed on the second region of the first conductivity type through an insulating film.

The complementary semiconductor integrated circuit device has a structure as described above. Therefore, it has an advantage that a capacitance portion having a large capacitance value for absorbing a noise can be easily formed.

It is more preferred to provide the above described complementary semiconductor integrated circuit device with a second region of the second conductivity type having a second potential formed in the first region of the second conductivity type and a second conductive layer having the first potential formed on the second region of the second conductivity type.

According to the construction described above, noises included in the power supply and the reference voltages are absorbed, whereby the potentials thereof are prevented from changing.

The object and the features of the present invention will become apparent from the following description taken in conjunction with preferred embodiments thereof with reference to the accompanying drawings, throughout which like parts are designated by like reference numerals, and in which:

DESCRIPTION OF THE PREFERRED EMBODIMENTS

A first embodiment in accordance with the present invention is described hereinafter with reference to the drawings.

A complementary semiconductor integrated circuit device in accordance with the present invention is described by taking a CMOS inverter as an example.

Figure 4:
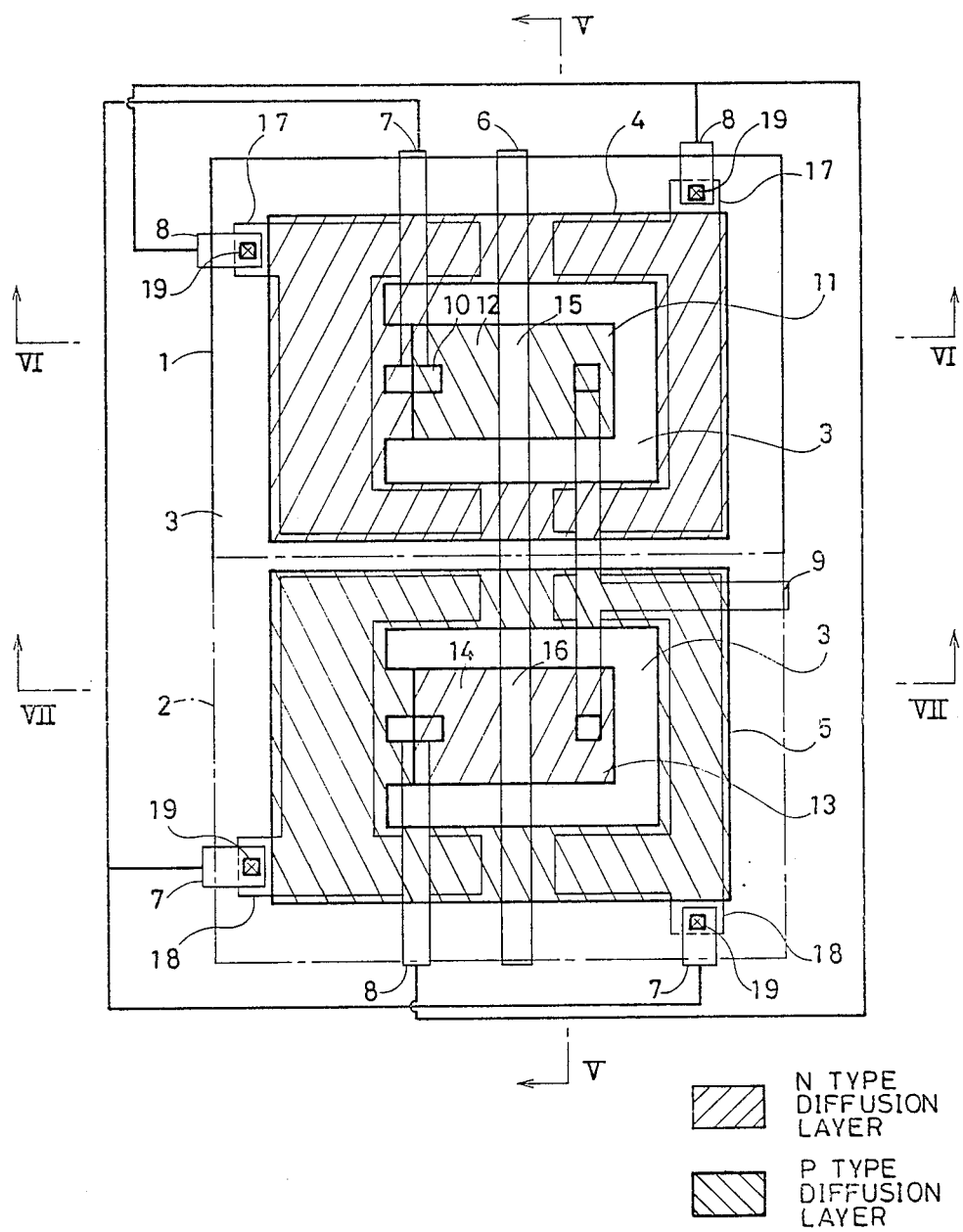
FIG. 4 is a plan view showing an inverter in accordance with the present invention.
Figure 5:
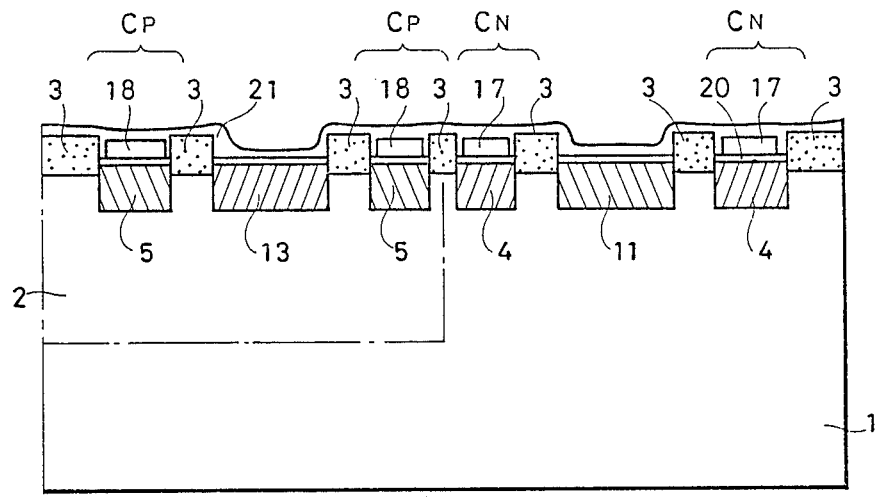
FIG. 5 is a sectional view taken along the line V—V shown in FIG. 4.
Figure 6:
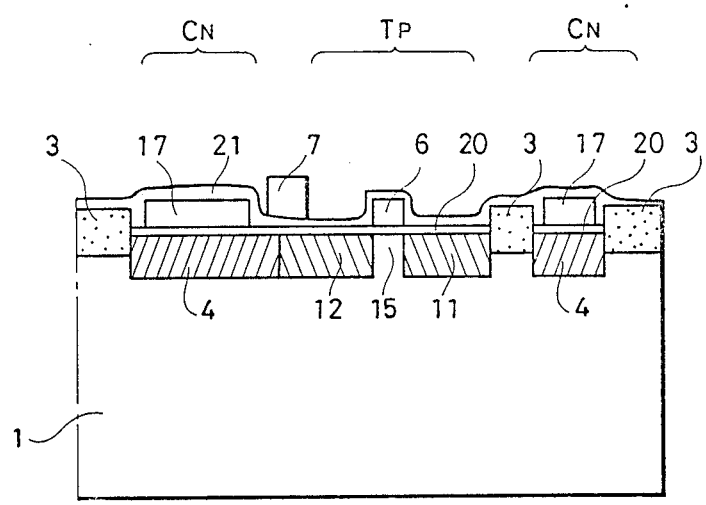
FIG. 6 is a sectional view taken along the line VI—VI shown in FIG. 4.
Figure 7:
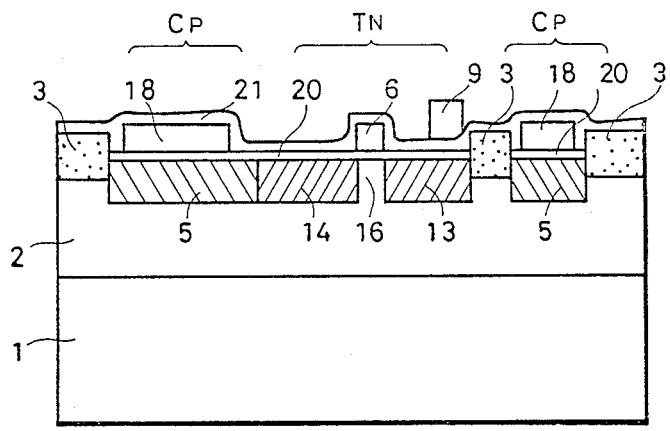
FIG. 7 is a sectional view taken along the line VII—VII shown in FIG. 4.

FIG. 4 is a plan view of a CMOS inverter employed in a complementary semiconductor integrated circuit device in accordance with the present invention; FIG. 5 is a sectional view taken along the line V—V shown in FIG. 4; FIG. 6 is a sectional view taken along the line VI—VI shown in FIG. 4; and FIG. 7 is a sectional view taken along the line VII—VII shown in FIG. 4.

As shown in FIGS. 4 through 7, a CMOS inverter employed in the complementary semiconductor integrated circuit in accordance with the present invention comprises a p-channel MOS transistor $T_P$ formed on an n-type semiconductor substrate 1; an n-channel MOS transistor $T_N$ formed in the p-well 2 provided in the n-type semiconductor substrate; an n-type diffusion layer 4 formed on the n-type semiconductor substrate 1, excluding the region where the p-channel MOS transistor $T_P$ is formed, a polysilicon layer 17 formed on the n-type diffusion layer 4 within an insulating film; a p-type diffusion layer 5 formed on the surface of the p-well 2 excluding the region where the n-channel MOS transistor $T_N$ is formed, and a polysilicon layer 18 formed on the p-type diffusion layer 5 within the insulating film. The polysilicon layers 17 and 18 are not formed on the gate 6 of polysilicon, which serves as the input of the CMOS inverter.

The polysilicon layer 17 is connected to the reference voltage through a contact hole 19 and an aluminum wire 8. The polysilicon layer 18 is connected to the power supply through the contact hole 19 and an aluminum wire 7.

The aluminum wire 7 connected to the power supply is separated from the polysilicon layer 17 connected to the reference voltage and the gate 6 of polysilicon serving as the input of the CMOS inverter by an insulating film 21. The aluminum wire 9 connected to the reference voltage is separated from the polysilicon layer 18 connected to the power supply and the gate 6 of polysilicon which serves as the input of the CMOS inverter by the insulating film 21.

Same reference numerals as those of the conventional inverter are adopted to the components of the inverter in accordance with the invention. The operation of the inverter in accordance with the invention is the same as that of the conventional one. Therefore, the explanation of the components is omitted.

According to the present invention, an insulating oxide layer 20 of a thin silicon dioxide film is disposed below the polysilicon layer 17. The n-type diffusion layer 4 having the same potential as that of the semiconductor substrate 1 is disposed below the insulating oxide layer 20. A kind of capacitor $C_N$ is formed by the polysilicon layer 17, the insulating oxide layer 20, and the n-type diffusion layer 4. Therefore, the reference voltage conductor 8 has a great capacitance, thereby absorbing a noise included in the potential of the reference voltage. The power supply conductor 7 is connected to the polysilicon layer 18 through the contact hole 19. The thin insulating oxide layer 20 is disposed below the polysilicon layer 18. The p-type diffusion layer 5 which has the same potential as that of the p-well 2 is disposed below the insulating oxide layer 20. A capacitor $C_p$ is formed of the polysilicon layer 18, the insulating oxide layer 20, and the p-type diffusion layer 5. The capacitor $C_p$ allows the power supply conductor 7 to have a great capacitance value, so that the potential of the power supply $V_{DD}$ is prevented from changing when a noise is included therein.

Figure 8:
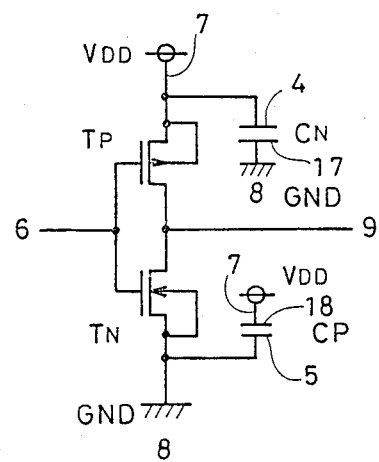
FIG. 8 is the equivalent circuit of an inverter, shown in FIG. 4, in accordance with the present invention.

FIG. 8 shows the equivalent circuit of the CMOS inverter employed in a complementary semiconductor integrated circuit device according to the present invention.

Figure 1:
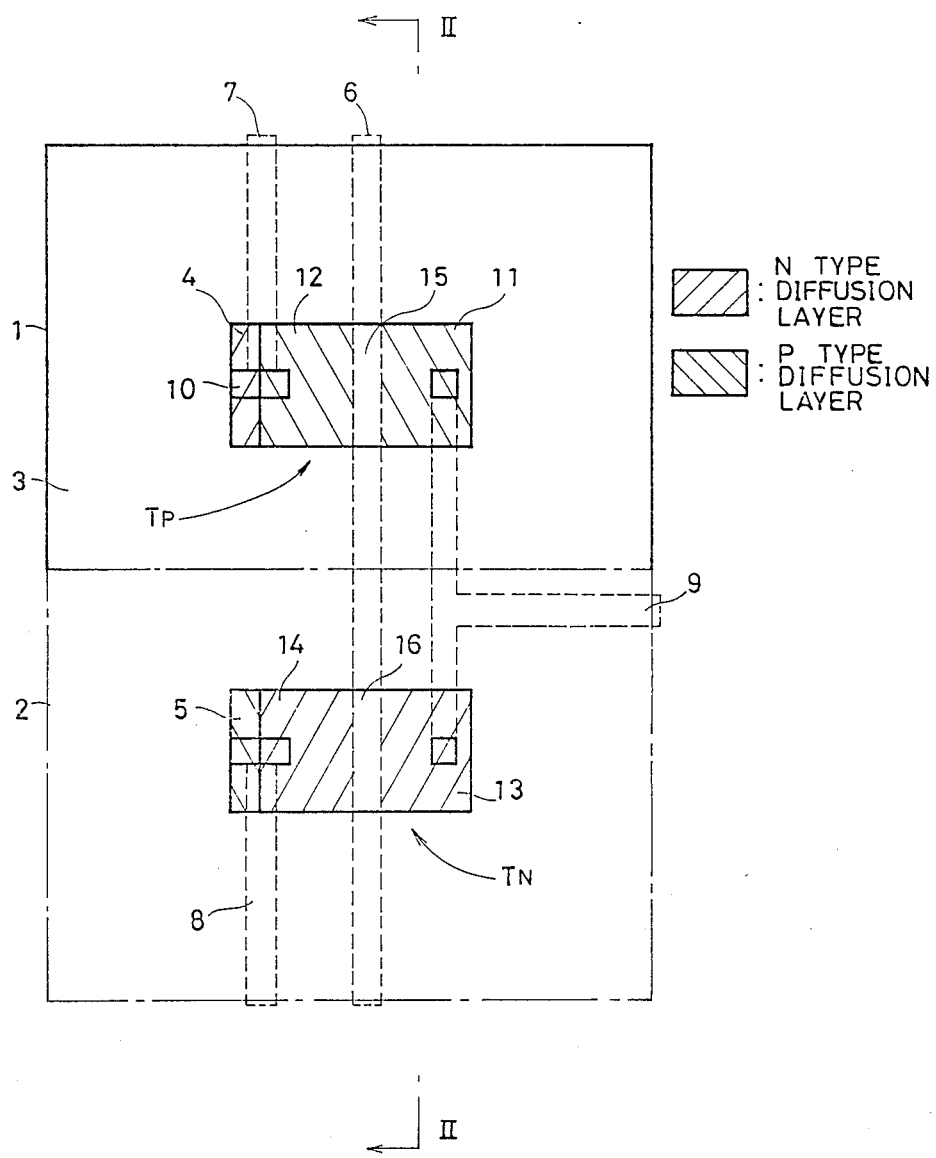
FIG. 1 is a plan view showing a conventional inverter.
Figure 2:
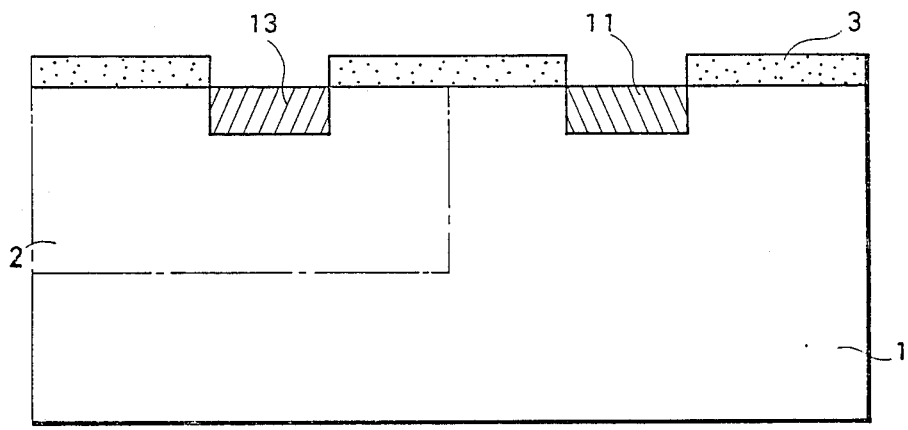
FIG. 2 is a sectional view taken along the line II—II shown in FIG. 1.
Figure 3:
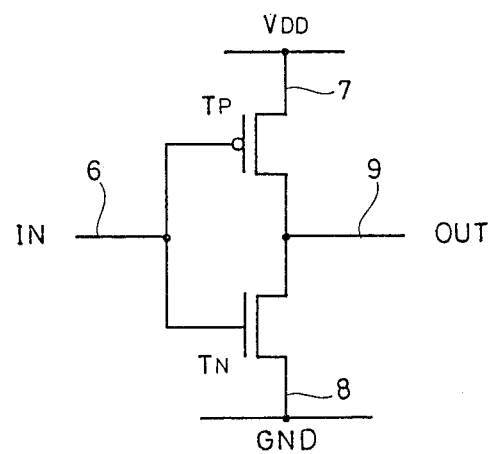
FIG. 3 is an equivalent circuit of the conventional inverter.

As shown in FIG. 8, the equivalent circuit of the CMOS inverter employed in the complementary semiconductor circuit device according to the present invention includes the capacitor $C_N$ provided between the source of the transistor $T_P$ and the reference voltage, and the capacitor $C_P$ provided between the the source of the transistor $T_N$ and the power supply $V_{DD}$ in comparison with one shown in FIG. 3.

Accordingly, the capacitor $C_N$ absorbs a noise included in the supply voltage $V_{DD}$. At this time, the transistor $T_P$ does not malfunction. Likewise, the capacitor $C_P$ absorbs a noise included in the reference voltage. At this time, the transistor $T_N$ does not malfunction.

Figure 9A:
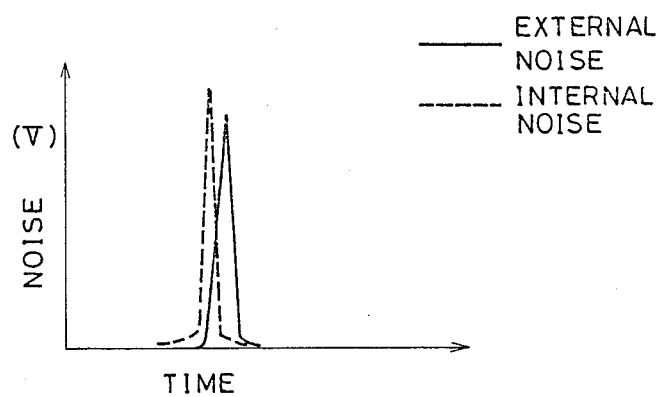
FIGS. 9A and 9B are graphs showing the performances of the inverter in accordance with the present invention and the conventional inverter.
Figure 9B:
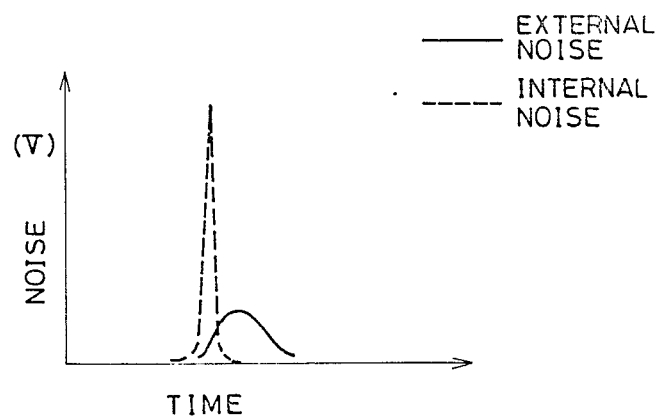

FIG. 9A shows the performance of a CMOS inverter employed in a conventional complementary semiconductor integrated circuit device. FIG. 9B shows the performance of the CMOS inverter employed in 0the complementary semiconductor integrated circuit device according to the present invention.

FIG. 9A shows the relationship between an external noise included in either power supply or reference voltage and a noise transmitted internally in a conventional inverter. FIG. 9B shows the relationship between an external noise and an internal noise transmitted in the CMOS inverter employed in the complementary semiconductor integrated circuit device according to the present invention. Referring to FIGS. 9A and 9B, the ordinate indicates the magnitudes of noises and the abscissa indicates time. The dotted lines show external noises included in either the power supply or the reference voltage. The solid lines show noises transmitted to the internal circuits of the CMOS inverters. The graphs are drawn to show only the difference in the magnitudes of noises between ones included in the power supply and so on and ones transmitted to the internal circuit. Therefore, the graphs have no graduations.

As apparent from FIGS. 9A and 9B, the magnitude of a noise transmitted to the circuit of the CMOS inverter employed in the complementary semiconductor integrated circuit according to the present invention is less than that transmitted to the conventional inverter.

In the above described embodiment, the capacitors $C_N$ and $C_P$ are formed in the n-type semiconductor substrate 1 and in the p-well 2, respectively; however, the noise included in the power supply $V_{DD}$ can be absorbed only if the capacitor $C_P$ is formed in the n-type semiconductor substrate 1. Likewise, the noise included in the reference voltage can be absorbed only if the capacitor $C_N$ is provided in the p-well.

Polysilicon is used as the material for gate layers 17 and 18 in this embodiment, however, it may be replaced with other substances so as to obtain the efficiency similar to that obtained by using polysilicon.

In summary, the complementary semiconductor integrated circuit device in this embodiment comprises the the first region of the first conductivity type to which the first potential such as the power supply is applied and the first region of the second conductivity type to which the second potential such as the reference voltage is applied. The first region of the first conductivity type comprises the second region of the second conductivity type, the second region of the first conductivity type, and the first conductive layer formed on the second region of the first conductivity type through the insulating film and connected to the second potential. The first region of the second conductivity type comprises the third region of the first conductivity type, the third region of the second conductive type, and the second conductive layer formed on the third region of the second conductivity type through the insulating film and connected to the first potential.

The above described complementary semiconductor integrated circuit device includes a capacitance formed by the second layer of the first conductivity type, the first conductive layer, and the insulating layer provided therebetween and a capacitance formed by the third region of the second conductivity type, the second conductivity layer, and the insulating layer provided therebetween.

Accordingly, noises included in the first and the second potential is absorbed by the capacitor $C_N$ and $C_P$. Consequently, the capacitors $C_N$ and $C_P$ are capable of preventing the potentials of the first and second supply voltages from changing, i.e., the complementary semiconductor integrated circuit device according to the present invention is prevented from malfunctioning.

Although the present invention has been fully described with reference to several preferred embodiments, many modifications and variations thereof will now be apparent to those skilled in the art, and the scope of the present invention is therefore to be limited not by the details of the preferred embodiments described above, but only by the terms of the appended claims.

What is claimed is:

1. A semiconductor circuit device capable of absorbing noise comprising
   a semiconductor device including:
   (a) a semiconductor substrate having a first region of a first conductivity type maintained at a first potential and a first region of a second conductivity type maintained at a second potential;
   (b) a second region of the second conductivity type formed in said first region of the first conductivity type; and
   a capacitor including:
   (a) a second region of the first conductivity type adjacent said second region of the second conductivity type formed in said first region of the first conductivity type;
   (b) a first conductive layer formed on said second region of the first conductivity type and connected to a source of said second potential; and
   (c) an insulating layer provided between said second region of the first conductivity type and said first conductive layer.

2. A complementary semiconductor circuit device capable of absorbing noise comprising:
   a first semiconductor device including:
   (a) a semiconductor substrate having a first region of a first conductivity type maintained at a first potential and a first region of a second conductivity type maintained at a second potential; and
   (b) a second region of the second conductivity type formed in said first region of the first conductivity type; and
   a first capacitor including:
   (a) a second region of the first conductivity type adjacent said second region of the second conductivity type formed in said first region of the first conductivity type;
   (b) a first conductive layer formed on said second region of the first conductivity type and connected to a source of said second potential; and
   (c) an insulating layer provided between said second region of the first conductivity type and said first conductive layer; and
   a second semiconductor device including:
   (a) a third region of a first conductivity type maintained at said second potential in a region of the substrate formed as a second conductivity type and maintained at said first potential; and (b) a fourth region of the first conductivity type formed in said first region of the second conductivity type; and a second capacitor including:
(a) a fourth region of the second conductivity type formed in said first region of the second conductivity type adjacent said third region of the first conductivity type formed in said first region of the second conductivity type;
(b) a second conductive layer formed on said third region of the second conductivity type and connected to a source of said first potential; and
(c) an insulating layer provided between said third region of the second conductivity type and said second conductive layer.

3. A complementary semiconductor circuit device in accordance with claim 2, wherein said first conductive layer and said second conductive layer each include a polysilicon layer.

4. A complementary semiconductor circuit device in accordance with claim 3, wherein said first potential includes the supply voltage and said second potential includes the reference voltage.

5. A complementary semiconductor circuit device in accordance with claim 2, wherein said second region of the second conductivity type includes a fifth region of the second conductivity type and a sixth region of the second conductivity type formed with a prescribed spacing provided therebetween; said device further comprising:
a third conductive layer formed on a region provided between said fifth region of the second conductivity type and said sixth region of the second conductivity type within an insulating film;
whereby a first field effect transistor is constructed by said fifth region of the second conductivity type, said sixth region of the second conductivity type and said third conductive layer.

6. A complementary semiconductor circuit device in accordance with claim 5, wherein said third region of the first conductivity type includes a fifth region of the first conductivity type and a sixth region of the first conductivity type formed with a prescribed spacing provided therebetween; and
a fourth conductive layer formed on an upper portion of a region provided between said fifth region of the first conductivity type and said sixth region of the first conductivity type within an insulating film;
whereby a second field effect transistor is constructed by said fifth region of the first conductivity type said sixth region of the first conductivity type and said fourth conductivity layer.

7. A complementary semiconductor circuit device in accordance with claim 6, wherein said third conductive layer of said first field effect transistor is integrally connected with said fourth conductive layer of said second field effect transistor so as to form an input.

8. A complementary semiconductor circuit device in accordance with claim 7, wherein said fifth region of the second conductivity type of said first field effect transistor is integrally connected with said fifth region of the first conductivity type of said second field effect transistor so as to form an output.

9. A complementary semiconductor circuit device in accordance with claim 8, wherein said first field effect transistor and said second field effect transistor form a CMOS inverter.

10. A complementary semiconductor circuit device in accordance with claim I, wherein the capacitance value of said first capacitance is selected as a value capable of substantially absorbing a noise voltage when noise is included in said first potential.

11. A complementary semiconductor circuit device in accordance with claim 2, wherein the capacitance value of said second capacitance is selected as a value capable of substantially absorbing a noise voltage when noise is included in said second potential.

* * * * *